United States Patent [19]
Jones et al.

[11] Patent Number: 5,388,903
[45] Date of Patent: Feb. 14, 1995

[54] MULTIFACETED MODULAR ENCLOSURE FRAME WITH INTEGRAL SUB-PANEL GUIDE SYSTEM

[75] Inventors: Trent T. Jones, White Bear Lake; Marc T. Fuller, Minneapolis, both of Minn.

[73] Assignee: Federal-Hoffman, Inc., St. Paul, Minn.

[21] Appl. No.: 202,202

[22] Filed: Feb. 25, 1994

Related U.S. Application Data

[63] Continuation of Ser. No. 799,408, Nov. 27, 1991.

[51] Int. Cl.⁶ .............................................. A47B 88/00
[52] U.S. Cl. .............................. 312/334.29; 312/265.3; 361/829; 361/741
[58] Field of Search .............. 312/334.6, 265.4, 265.6, 312/265.2, 265.3, 334.29; 52/488, 489, 280, 656, 710; 361/829, 756, 727, 741

[56] References Cited

U.S. PATENT DOCUMENTS 4,643,319  2/1987  Dubuse et al. .
5,202,818  4/1993  Betsch et al. .

FOREIGN PATENT DOCUMENTS 167833   1/1986   European Pat. Off. .
402276  12/1990   European Pat. Off. .
2681478  3/1993   France .
7520183 10/1975   Germany .
8701711  5/1987   Germany .
8703617  8/1987   Germany .
2000017  1/1979   United Kingdom .

OTHER PUBLICATIONS

Hoffman Weldment Dwg. No. 31D11-003, Sheet 2, dated Jul. 14, 1989.
Hoffman Catalogue, pp. 284-290, Feb. 1988.
Sarel Spacial 6000 Brochure, undated.
Hoffman Frame Dwg. No. 31C49-002, dated Jul. 20, 1989
Hoffman Frame Dwg. No. 31C54-002, dated Aug. 31, 1989.
Hoffman Frame Dwg. No. 30C55, dated Apr. 27, 1984.
Hoffman Frame Dwg. No. 30C58, dated Nov. 3, 1989.
Hoffman Frame Dwg. No. 31C53-002, dated Jul. 20, 1989.
Hoffman Weldment Dwg. No. 31D11-003, Sheet 1, dated Jun. 22, 1989.

*Primary Examiner*—Peter R. Brown
*Assistant Examiner*—Gerald A. Anderson
*Attorney, Agent, or Firm*—Schroeder & Siegfried

[57] ABSTRACT

A multifaceted modular enclosure frame which is constructed of a latticework of identical cross-sectionally configured frame sections that include an inherent integrally formed guide system for proper installation and positioning of sub-panel mounting boards within the enclosure. Each frame section defines an interiorly disposed guide channel and mounting flange, an exteriorly disposed corner flange, and an exteriorly disposed flange trough, while maintaining an open design and a cross-sectional configuration which mates cooperatively with other identically configured frame sections to provide an integral mitered corner which is devoid of separate corner adapter inserts. The interiorly disposed guide channel provides the integral guide system for the sub-panel mounting boards which are received within the enclosure. Each corner flange defined by such frame sections provides an exterior surface upon which mounting blocks are carried to provide for complete external connection of enclosure wall panels thereto. The exteriorly disposed flange trough provides a sealing surface for such wall panels and prevents liquids from pooling up against, and deteriorating, the enclosure gaskets.

12 Claims, 7 Drawing Sheets

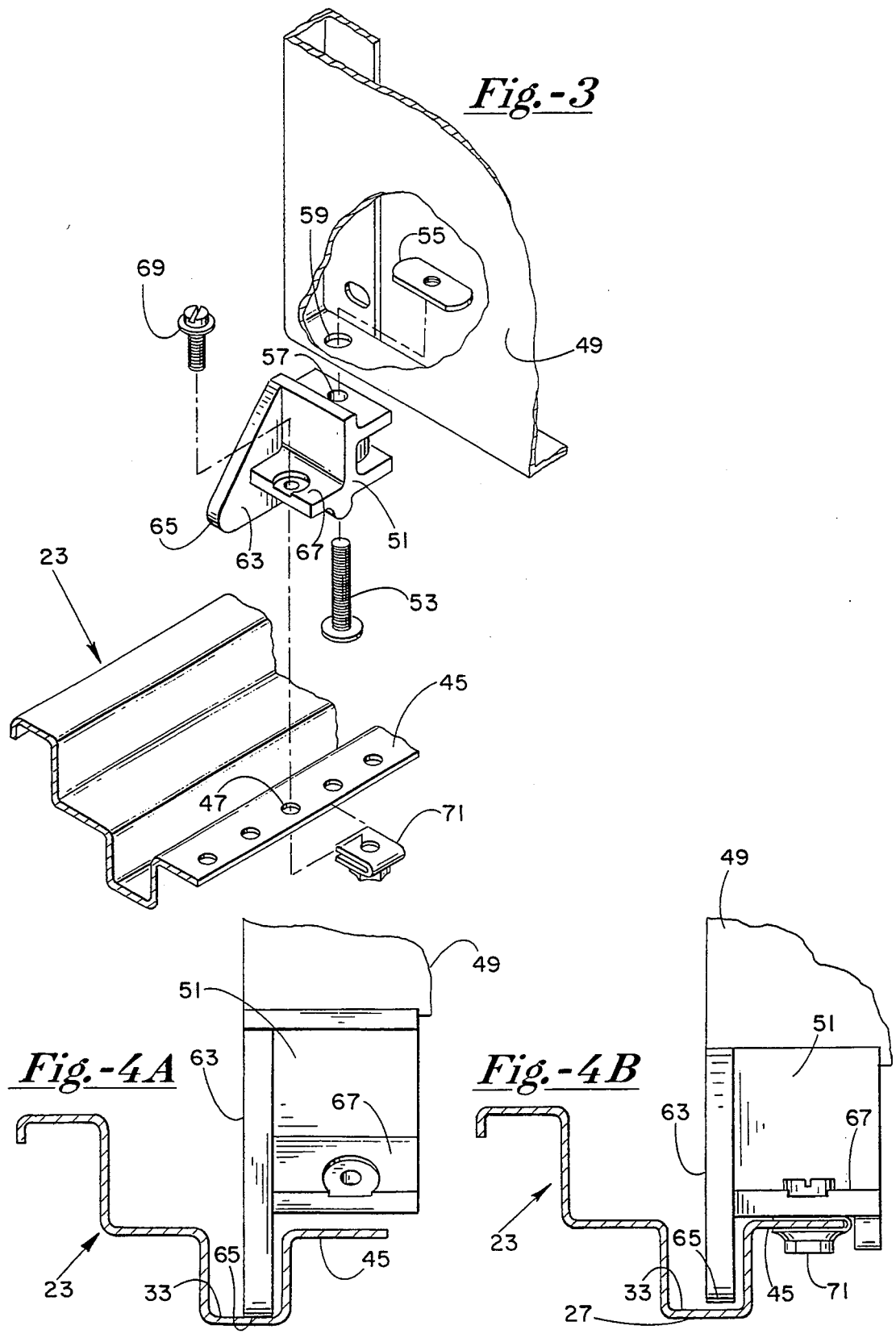

MULTIFACETED MODULAR ENCLOSURE FRAME WITH INTEGRAL SUB-PANEL GUIDE SYSTEM

This application is a continuation of application Ser. No. 07/799,408, filed Nov. 27, 1991, pending.

DESCRIPTION

BACKGROUND OF INVENTION

Enclosure systems as in the type described herein are generally used in connection with large and/or small electrical switch board systems, and are commonly used to house a plurality of interior mounting boards and accessories for holding electrical compon-ents, etc. Such enclosures may or may not require environmental control therewithin, and are generally filled to maximum capacity with components.

It has become increasingly important in manufacturing such enclosures that the manufacturer be able to meet the changing demands of its customers, and provide an enclosure which is highly versatile, efficient to use, readily restructurable and capable of being modified as needed. It is also desirous to utilize the interior space of such enclosures as efficiently as possible, and to provide an interior which is substantially obstruction-free, since such enclosures are often filled to maximum capacity with sub-panel mounting boards and other assemblies.

Since the interiors of such electrical enclosures must frequently be accessed, it is desirous to manufacture an enclosure which is user friendly, and which provides the maximum number of user options for accessibility in the most efficient manner possible. From a manfacturing standpoint, it is desirous to pro-vide the maximum number of benefits while maintaining ease and versatility in the construction thereof, at a minimum cost. It is with the above goals in mind that we have developed a highly versatile enclosure frame which provides a number of benefits over conventional enclosures.

Conventional electrical enclosures have historically been extremely cumbersome to work with because of the difficulty in accessing the interior thereof, which is caused by overcrowding the interior with electrical components, etc. Moreover, such con-ventional enclosures are difficult, if not impossible, to restructure or modify because, in order to do so, one must access its interior to disassemble the outer wall panels. In order to access the interior, electri-cal components and sub-panels within the conventional enclosure must generally be removed. Only then can one access the interior connections for the outer wall panels. Such sub-panels are frequently heavy and bulky, making them difficult to maneuver or remove. As a consequence, restructuring a conventional enclosure to meet the demands of a customer becomes a tedious task which requires a substantial amount of time and labor.

Another problem commonly associated with conventional modular enclosures is that the framework thereof is often constructed with a closed design. Each frame section is designed such that its cross section defines an enclosed area, somewhat tubular in shape. By reason thereof, special connectors and adapters must be manufactured to join adjacent sections of frame, and to mount interior racks and accessories therein. Such a closed design also makes it extremely difficult to maintain and repaint the frame, when needed. An example of such a conventional enclosure is shown in U.S. Pat. No. 4,643,319.

For the above reasons, there is a distinct need for an enclosure with easily removable sub-panel mounting boards that can be installed and repositioned with relative ease to minimize time and labor associated therewith. There is also a distinct need for an enclosure which is readily accessible to the interior, and which can be restructured solely from the exterior, without requiring removal of interior sub-panels and other interiorly mounted electrical components. Moreover, such an enclosure should have an open frame design with which conventional nuts and bolts may be used, without the need for special adapters.

With the above in mind, we have developed a multifaceted enclosure frame which solves each of the above described problems, and provides other benefits as well. We have developed a modular frame which comprises a plurality of frame sections that provide an integrally formed sub-panel guide system for simplified installation and proper positioning of sub-panels within the enclosure. Although some conventional enclosures are known to have sub-panel guide systems, none are integrally formed with the enclosure frame. As such, they require separate installation, which increases the time, cost and tediousness of manufacturing and assembling such enclosures.

The frame sections of our modular frame are also constructed to have identical cross-sections for ease of manufacturing and assembly, and provide for solely external mounting of all enclosure wall panels thereto. As an added feature, each frame section is designed such that, when assembled, an exterior flange trough is formed which prevents water from pooling up and deteriorating the enclosure seals.

All of the above features and benefits are accomplished via the assembly of a latticework of frame sectons, each having an identical cross-section, and each being engineered with an open design that cooperatively mates with other frame sections at the corners of the frame where they are welded together, thereby eliminating the need for separate adapters to join such frame sections. The essence of the invention disclosed herein is the fact that all of the above benefits are incorporated into an integral enclosure frame section, which significantly recudes time and labor of assembly, and increases the use and accessiblity of the interior space of the enclosure.

SUMMARY OF THE INVENTION

By reason of the problems associated with the use and restructurability of conventional electrical enclosures, we have sought to develop an enclosure which is highly versatile, efficient to manufacture and user friendly. As a result of the above, we have developed a free-standing multifaceted modular enclosure frame which requires a minimal amount of assembly and provides a number of benefits and solutions to those problems associated with conventional enclosures.

Our newly developed enclosure frame comprises a plurality of frames sections having identical cross-sections which can be assembled into an integral latticework that defines the frame of the enclosure. The cross-section of each section of the frame is designed such that it will mate cooperatively with other identical frame sections to form integral welded corners of the frame, without the use of separate adapters for connection thereof.

Each frame section has an open seven-fold integral design which is easily produced with conventional press brake tooling, or via roll forming. The openness of the design enables the use of conventional nuts and bolts for mounting interior accessories, etc., and enables the manufacturer and/or user of the enclosure to easily maintain and paint the frame, as needed. The above advantages of having an open frame section design can be readily appreciated when one considers the increased cost involved in manufacturing specialized connectors for interior mounting of electrical components and accessories, and the difficulty and time involved in properly maintaining and painting frame sections which have a closed configuration.

While maintaining an open cross-sectional design, a number of other user friendly advantages have been incorporated into our newly developed enclosure frame. Each frame section is designed so as to form an interiorly disposed integral guide channel member. When assembled, the interiorly disposed channel of the lower base frame sections form an integral guide system for proper positioning and installation of sub-panel mounting boards within the enclosure. Integral formation of such a guide system in the frame members itself eliminates the time, labor and cost, as well as the necessity, of mounting a separate sub-panel guide system within the enclosure. Without such a guide system, such mounting boards are extremely difficult to install and position properly within the enclosure.

While providing a unique integral sub-panel guide system in the lower base frame sections of the enclosure, the same channel member provides additional benefits when such frame sections are used as vertical members of the frame. As vertical frame sections, the opposite or exterior facing surface of the integrally formed channel member provides a sealing surface against which various exterior wall panels of the enclosure may seal.

Each frame section also incorporates an interiorly disposed mounting flange. The interiorly disposed flange is provided with a plurality of spaced openings along the length thereof which, when assembled, defines a modular array of standard spaced horizontal and vertically disposed mounting holes which are compatible with industry standards. As such, the frame is entirely modular and capable of receiving any rack, or other accessory, which is designed to meet industry standards.

Each specific frame section is also designed and folded to form a corner flange which, when assembled, defines an exteriorly disposed corner or edge along the outer confines of the enclosure framework. This exterior corner flange is particularly important in that it is designed with proper dimensions such that it may receive and carry a plurality of exterior mounting blocks thereon. Such mounting blocks are secured to each corner flange and provide means by which the side and rear wall panels, and the front door panel of the enclosure, may be connected to the frame solely from the exterior, without the need for accessing the interior of the enclosure. As stated above, this is particularly important since such electrical enclosures are frequently overcrowded with electrical components, sub-panel mounting boards, racks, etc., which severely limits the space one has to work in the interior thereof. The capability of being able to mount and remove the enclosure wall panels solely from the exterior of the enclosure provides a readily apparent advantage over conventional enclosures.

In addition to the above advantages, each frame section is designed and folded so as to form an exterior flange trough which, when assembled, defines a trough that channels water and other liquids around the peripheral portions of the frame, thereby preventing any liquid from pooling against, and consequently deteriorating, the gaskets which seal the specific wall panels to the frame. When the latticework of frame sections is completely assembled, the front and rear openings of the resulting frame are outlined by the exterior flange trough, which provides a surface against which the front and rear door/wall panels may seal. The side openings, which are formed by the latticework of frame sections, are designed such that the side wall panels seal against the flange trough at the top and bottom ends thereof, and against the exteriorly facing surface of the vertical frame section channel members, on the sides thereof.

As is readily apparent from the above, we have solved a multitude of problems associated with conventional enclosures, and in the process thereof, we have developed a highly versatile integral frame section with an open design that provides many advantages, is efficient to manufacture, and most importantly, is user friendly. Our multifaceted modular frame for electrical enclosures provides an integral sub-panel mounting board guide system, as well as a unique method for externally mounting the enclosure wall panels thereto. The unique open cross-sectional design of each frame section allows for manufacturing and assembly of an integral frame with cooperatively mating corners, which eliminates the need for separate corner adapters. The open design also provides for ease of maintenance, and the exterior flange trough which is defined by each frame section effectively channels liquids off the enclosure and away from the gasketed portion thereof.

BRIEF DESCRIPTION OF THE DRAWINGS

These and other objects and advantages of the invention will more fully appear from the following description, made in connection with the accompanying drawings, wherein like reference characters refer to the same or similar parts throughout the several views, and in which:

FIG. 3 is a fragmentary exploded perspective view of one of the lower base sections of our modular enclosure frame, showing the integral sub-panel guide system formed therein and the manner in which it receives a sub-panel guide traveler therein;

FIG. 4A is a fragmentary vertical sectional view taken through one of the lower base sections of our modular enclosure frame, illustrating how the sub-panel and sub-panel guide travelers are tilted forward so as to glide within the integral sub-panel guide system of the enclosure frame;

FIG. 4B is a fragmentary vertical sectional view taken through one of the lower sections of our modular enclosure frame, illustrating how the sub-panel guide travelers are secured to the enclosure frame after the sub-panel is installed therein;

DETAILED DESCRIPTION OF THE INVENTION

Figure 1:
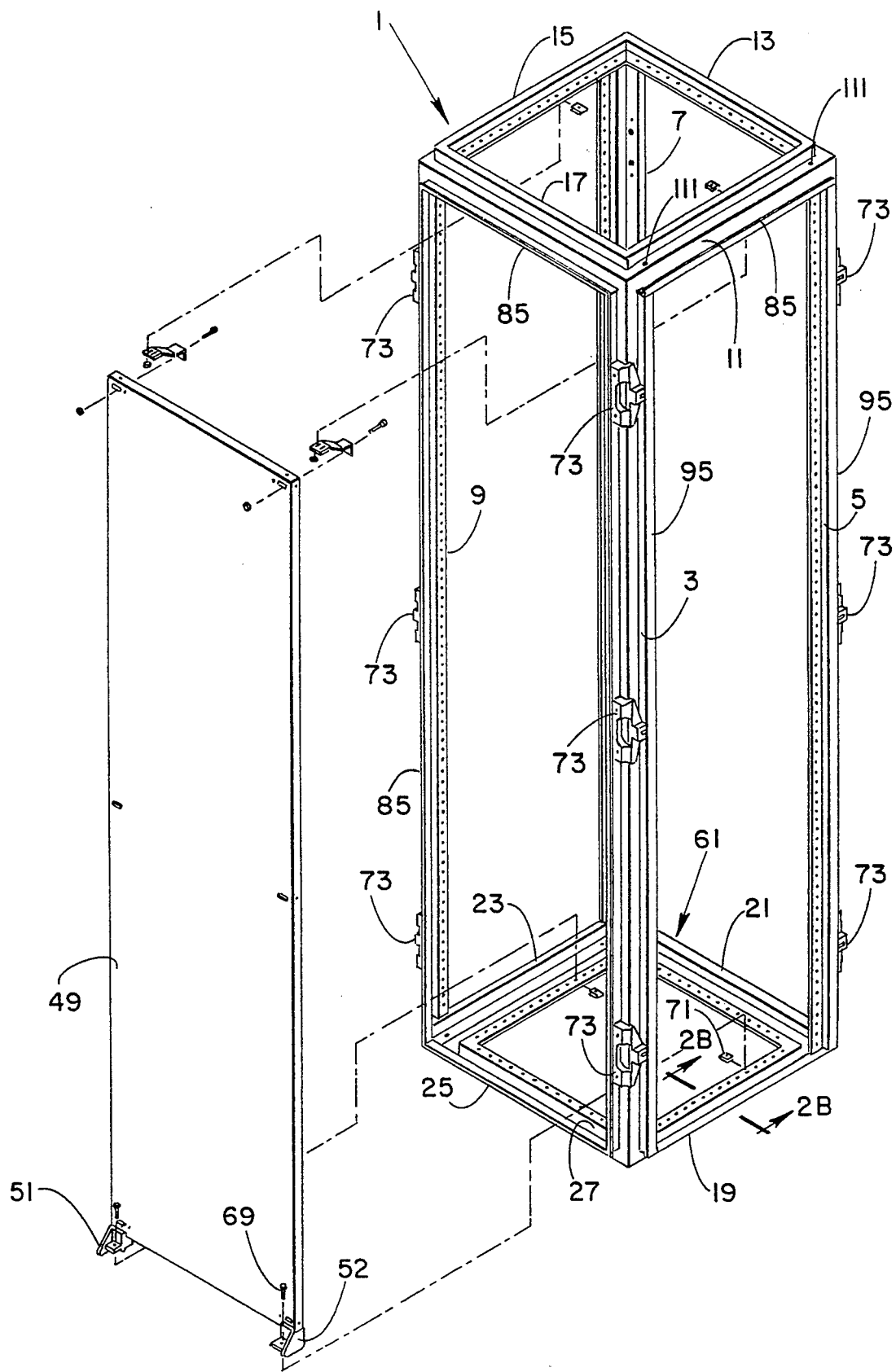
FIG. 1 is an exploded perspective view of our multifaceted modular enclosure frame, showing how a sub-panel mounting board is received and secured therewithin.

Shown in FIG. 1 of the drawings is our free-standing multifaceted enclosure frame which defines a plurality of top, bottom and side openings. Such openings are constructed to receive thereover a plurality of door and wall panels which define the confines of a rectangular enclosure. Modular frame 1 comprises a plurality of vertically upstanding corner frame sections 3, 5, 7 and 9 which are interconnected at their top ends by upper cross frame sections 11, 13, 15 and 17, and at their lower ends by lower cross frame sections 19, 21, 23 and 25.

Each frame section is designed with the identical cross-sectional configuration, and has been engineered to cooperatively mate with adjacent frame sections at each corner of the enclosure. As such, adjoining frame sections can be mitered and easily welded together to form integral corners, thereby avoiding the need for the use of corner adapters, which are frequently used to connect intersecting frame sections of conventional enclosures. Because each frame section is identically configured, a description of the cross-sectional configuration of one such frame section will serve as a description for all frame sections, the specific elements of each frame section being referred to by like numbers throughout the particular drawings.

Figure 2A:
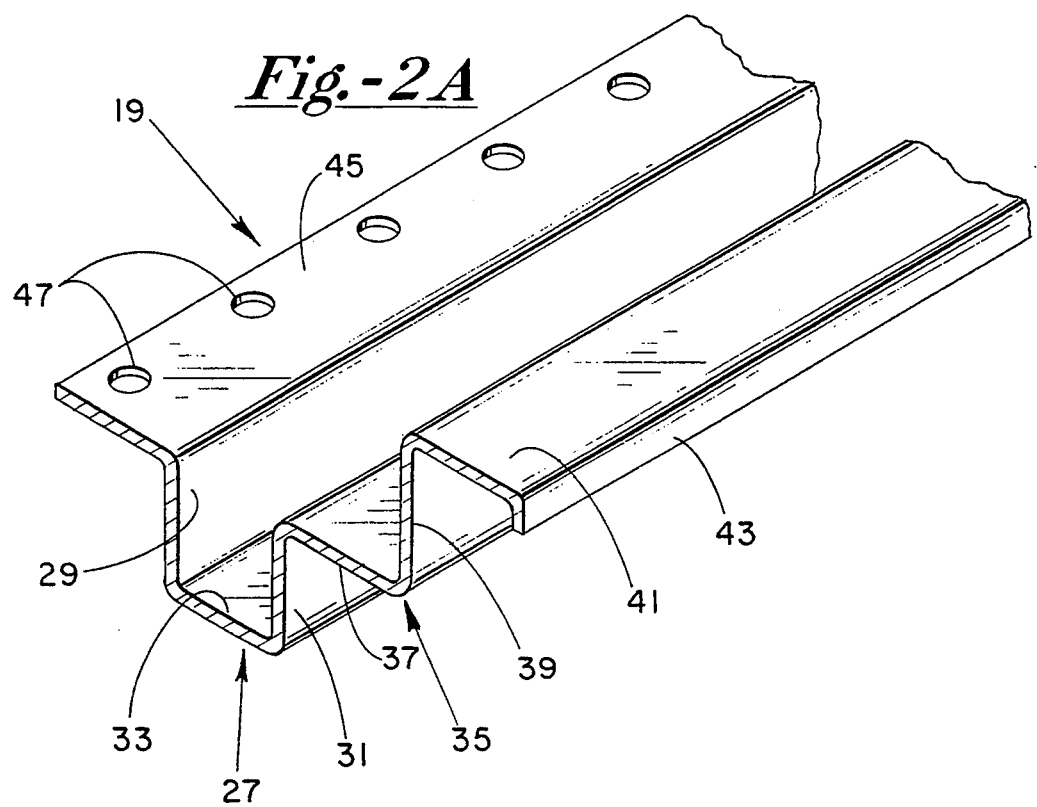
FIG. 2A is a fragmentary perspective view of a section of our modular enclosure frame, showing the open design thereof.
Figure 2B:
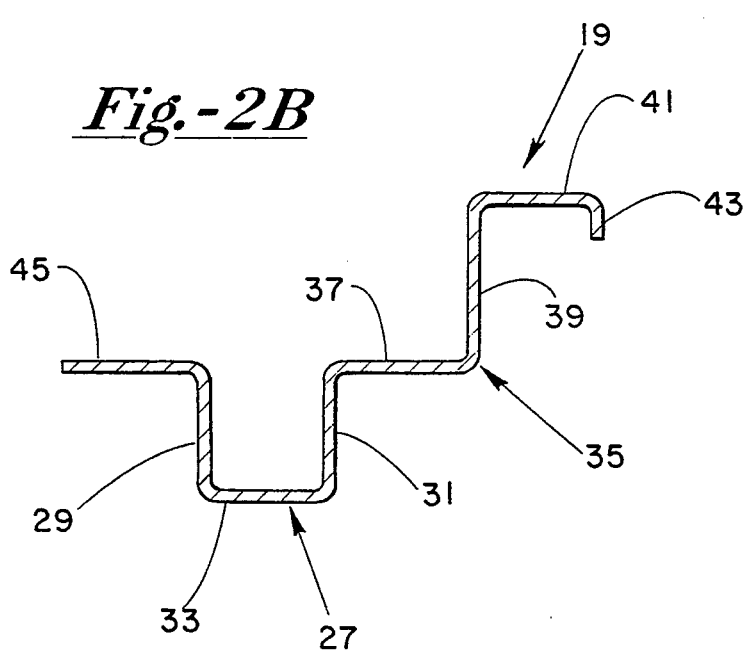
FIG. 2B is a cross-sectional view of a section of our modular enclosure frame, taken along lines 2B—2B in FIG. 1.

FIGS. 2A and 2B show the cross-sectional configuration of lower cross frame section 19. Frame section 19, and all other frame sections, are designed with an open seven-fold cross-sectional configuration, and constructed of a roll-formed steel to impart rigidity thereto. The term "open" design, as used herein and in the appended claims, means each frame section is devoid of any enclosed areas. The open design of such frame sections provides ease of maintenance, since there are no enclosed areas which must be reached when repainting becomes necessary. The openness of the design also enables the user of frame 1 to utilize conventional nuts and bolts when mounting interior racks and accessories therein, and exterior wall panels thereto. There is no need for specialized connectors to accomplish such mounting, as is commonly needed with conventional enclosures having closed cross-sectional designs.

As best shown in FIG. 2B, frame section 19 comprises a roll-formed generally U-shaped channel portion 27 which is defined by a pair of legs 29 and 31 which are interconnected at their lower ends by web portion 33. Cantilevered integrally from the upper end of leg 31 is a generally L-shaped angled exterior corner flange 35, which is comprised of arms 37 and 39. Corner flange 35 extends generally outwardly and upwardly away from channel portion 27. Cantilevered integrally from the top end of arm 39 is a second generally L-shaped flange 41, which extends outwardly away from channel 27 and corner flange 35. Flange 41 has an outer terminal lip portion 43 which extends downwardly at a right angle therefrom.

Extending normally outward from the upper end of leg 29 of channel member 27 is an interior mounting flange or rim 45. Mounting flange 45 includes a plurality of openings 47 which are disposed at spaced locations along the entire length of frame section 19. Openings 47 are spaced along mounting flange 45 of frame section 19, and all other frame sections, in accordance with industry standards, so as to modularize frame 1 and accommodate mounting of standard interior racks and accessories therewithin. Typically, the spacing of the whole pattern in the horizontally disposed cross frame sections, such as frame section 19, is 25 millimeters. The whole pattern spacing of vertically upstanding frame sections, such as frame section 3, is 0.875 inches.

Because frame section 19 is located at the base of frame 1, it extends in a horizontal plane, in the orientation shown in FIGS. 2A and 2B. Obviously, as the orientation of each identically configured frame section changes, the relative disposition of the various elements of the same will also change. For example, terminal lip portion 43 of vertically upstanding frame section 3 extends laterally, rather than downwardly, as described in connection with frame section 19. Similarly, terminal lip portion 43 extends upwardly on upper cross frame section 11. Although the relative disposition of the specific elements of each frame section may differ, the cross-section thereof remains identical. Thus, the relative orientation of each frame section must be taken into account when considering the construction thereof in reference to the above description.

With the specific construction and design of each frame section being described hereinabove, the particular advantages and functions provided by such a design can now be discussed. As shown in FIG. 1, modular enclosure frame 1 is designed to receive therein one or more sub-panel mounting boards 49. Mounting board 49 is constructed with dimensions such that it is capable of being cooperatively received within the interior confines defined by modular frame 1. Mounting board 49 carries a pair of channel followers or guide travelers 51 and 52 at its lower end which function to guide mounting board 49 within the enclosure via an integral sub-panel guide system formed by lower cross frame sections 19, 21, 23 and 25, which will be described in more detail hereinbelow. Guide traveler 51 is carried by the lower left corner of mounting board 49, and guide traveler 52 is carried by the lower right corner thereof. As can be seen in FIG. 1, each guide traveler is constructed identically as the mirror image of the other.

As illustrated in FIG. 3, each guide traveler 51 and 52 is connected to its respective lower corner of mounting board 49 via a bolt 53 and locking nut 55. Bolt 53 extends through aperture 57 in guide traveler 51, and through opening 59 in the lower end of mounting board 49, where it receives locking nut 55 to fixedly secure the same thereto. Guide traveler 52 is connected to mounting board 49 in the same manner. The specific construction and function of such guide travelers 51 and 52 is described in more detail in co-pending application Ser. No. 799,339, entitled SUB-PANEL GUIDE SYSTEM FOR ELECTRICAL ENCLOSURES, the contents of which are incorporated herein by reference thereto.

As best shown in FIG. 1, lower cross frame sections 19, 21, 23 and 25 are welded together to form an integral base frame 61. Each lower cross frame section includes a sub-panel guide means comprising a guide channel 27 which is interiorly disposed relative to the confines defined by modular frame 1. Such guide channel 27 of each lower cross frame section is designed to cooperatively receive, in guiding relation therein, the depending portion 63 of an associated guide traveler 51 or 52. In one orienta-tion, as shown in FIG. 1, mounting board 49 can be arranged to extend between lower cross frame sections 19 and 23. In such case, depending portion 63 of guide traveler 51 extends into the guide channel 27 of lower cross frame section 23. Depending portion 63 of guide traveler 52 extends into guide channel 27 of lower cross frame section 19.

Mounting board 49 may also be rotated 90° in either direction and installed within enclosure frame 1 in such a position that the respective guide travelers 51 and 52 on the lower corners of board 49 will travel and be guided by the respective guide channels 27 in lower cross frame sections 21 and 25. In such case, the depending portions 63 of each respective guide traveler 51 and 52 will travel in the guide channel 27 of its associated lower cross frame section 21 or 25.

As illustrated in FIG. 4A, mounting board 49 is tilted forward as it is installed within modular enclosure frame 1, thereby causing each guide traveler 51 and 52 to tilt forward onto tip 65 of its respective depending portion 63. Tip 65 of each guide traveler 51 and 52 bears against and glides along web porton glide surface 33 of the guide channel 27 within which it travels, as mounting board 49 is moved inwardly into the enclosure. By tilting mounting board 49 forward, mounting shoulder 67 of each guide traveler 51 and 52 becomes spaced from mounting flange 45 of the lower cross frame section within which it travels. Thus, mounting board 49 is guided solely by the inter-engagement of the depending portions 63 of guide travelers 51 and 52 within the guide channels 27 of the respective lower cross frame sections within which they travel.

As illustrated best in FIGS. 1 and 4B, once mounting board 49 is positioned properly at a desired location within modular enclosure frame 1, it is tilted upright to facilitate connection of guide travelers 51 and 52 to the respective mounting flanges 45 of the lower cross frame sections within which they travel. Bolt 69 extends through the opening in mounting shoulder 67 of each guide traveler, and into a clip nut 71, which straddles mounting flange 45 in communicating relation with an opening 47 therein. FIG. 4B illustrates the connection of guide traveler 51 to lower cross frame section 23, it being understood that guide traveler 52 connects to its associated lower cross frame section in an identical manner.

Figure 5:
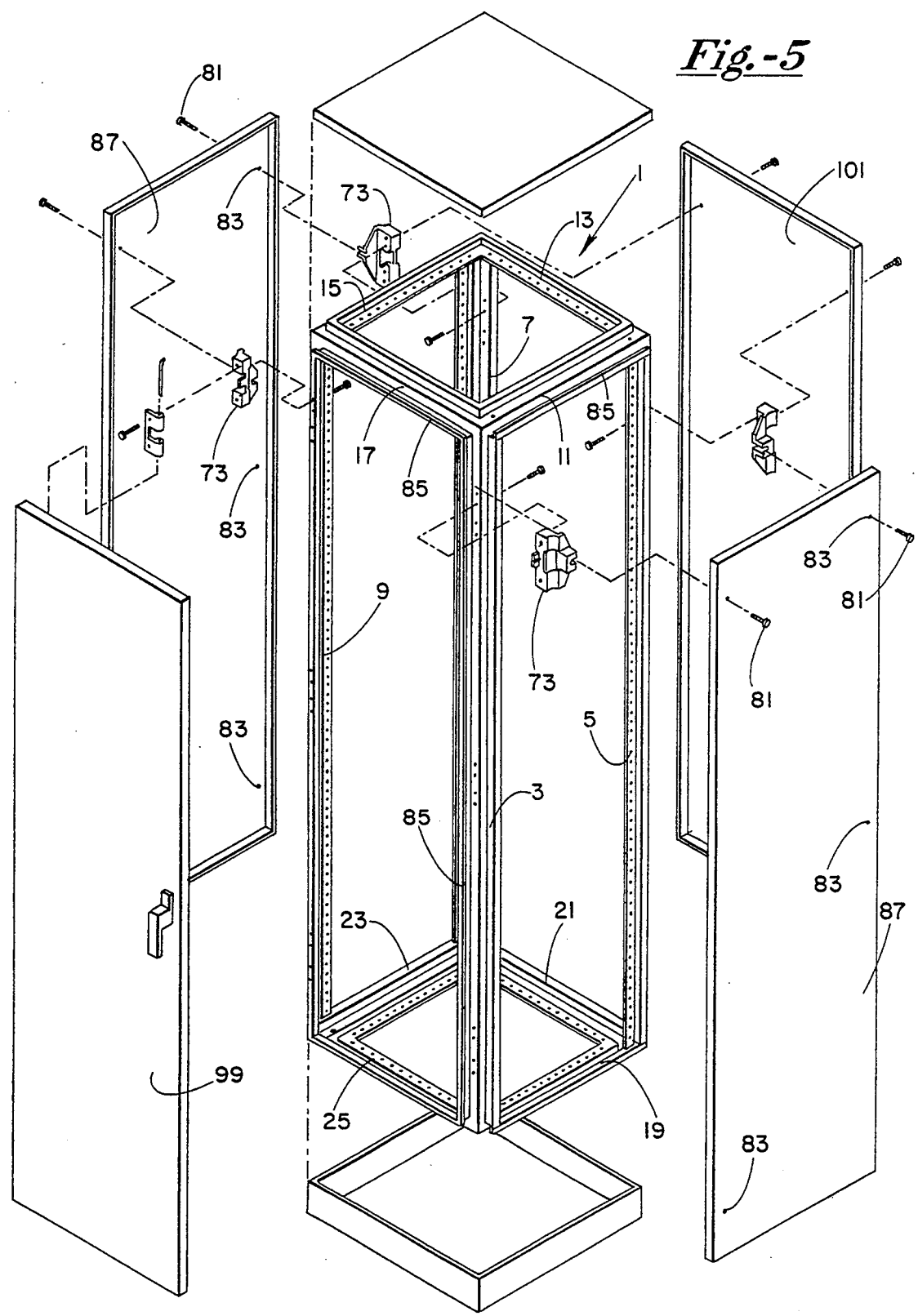
FIG. 5 is an exploded perspective view of our multifaceted modular enclosure frame, showing the external mounting blocks which are used therewith to facilitate external connection of the various enclosure wall panels thereto.

As shown in FIG. 1, the exterior corner flange 35 of each upstanding corner frame section 3, 5, 7 and 9 is designed and constructed to have a plurality of exterior mounting blocks 73 permanently secured thereto, to facilitate external mounting of the various door and wall panels to the modular frame 1. To prevent cluttering of the drawing, only the uppermost blocks 73 are shown in FIG. 5, it being understood that a plurality of such blocks are secured to frame 1, as shown in FIG. 1. The construction and function of mounting block 73 is covered in more detail in co-pending application Ser. No. 07/799,547 entitled RESTRUCTURABLE ENCLOSURE WITH MULTI-PURPOSE MOUNTING BLOCKS, the contents of which are incorporated herein by reference thereto.

Each mounting block 73 is shaped such that it wraps around and seats against arms 37 and 39 of the corner flange 35 of an upstanding corner frame section 3, 5, 7 or 9. On each upstanding frame section, arm 37 of corner flange 35 is orientated to face the side of enclosure frame 1, and arm 39 faces either the front or rear side thereof, depending on whether it is one of the forwardmost or rearmost frame sections. Because each block 73 wraps around corner flange 35 of the frame section to which it is secured, each block facilitates external connection of an adjacent front door panel 99 and side wall panel 87, or an adjacent rear wall panel 101 and side wall panel 87, to enclosure frame 1.

Figure 6:
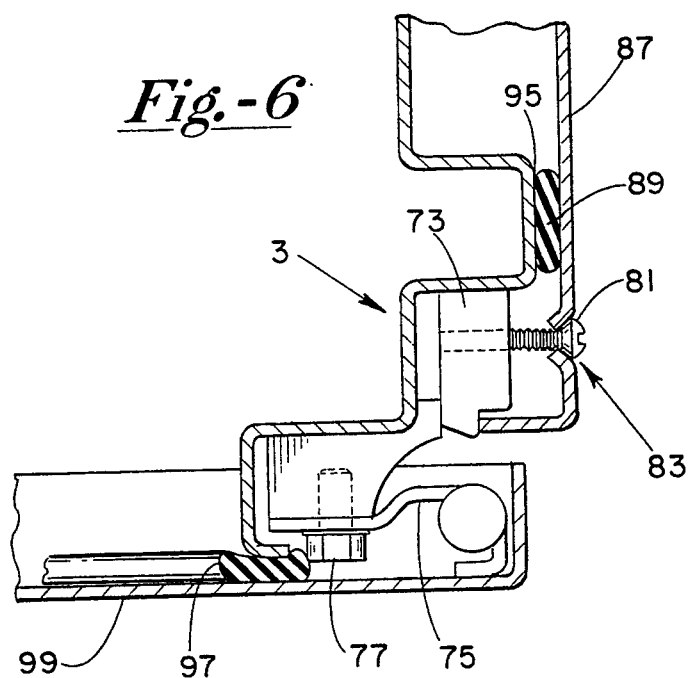
FIG. 6 is a fragmentary horizontal sectional view taken through one of the upstanding corner frame sections of an assembled enclosure similar to that shown in exploded perspective in FIG. 5, showing the manner in which the mounting blocks and wall panels are secured to our multifaceted modular enclosure frame.

For exemplary purposes, one such mounting block 73 is shown in FIG. 6 mounted upon upstanding corner frame section 3. A hinge assembly 75 is externally secured to mounting block 73 via one or more threaded bolts. Door panel 99 is shown hingedly connected to hinge assembly 75. Similarly, side panel 87 is secured to mounting block 73 via a bolt 81 which extends through opening 83 in side panel 87, and into mounting block 73. Each side panel 87 has a plurality of such openings 83, which are spaced about the periphery thereof in communicating relation with the various mounting blocks 73. By designing a modular frame section with an external corner flange 35, all door and wall panels can be externally connected to the enclosure frame 1 via the user of external mounting blocks 73, without the need for accessing the interior thereof. For reasons previously described hereinabove, this is a marked improvement over conventional enclosures of this type.

As seen best in FIGS. 1 and 5, outwardly extending flange 41 with lip portion 43 provides a flange trough collar 85 which, when assembled into modular frame 1, extends around the periphery of the front door opening and rear panel opening defined thereby. A similar flange trough collar 85 is also created at the top edge of each side opening defined by modular frame 1. As can be best seen by FIG. 7, such flange trough collars 85, which extend across the top edge of the various wall openings defined by modular frame 1, function as a channel element which directs water or other liquids that come in contact with the enclosure around the peripheral edges thereof, so as to prevent a pooling effect of such liquids against the various gaskets which seal the door and other wall panels against the enclosure frame 1.

Outwardly extending flange 41 with lip portion 43 also provides an exterior sealing surface for the various wall panels of the enclosure, upon assembly of frame 1. As shown best in FIG. 6, a continuous seal 97 is carried by, and extends around, the peripheral portion of the front door panel 99, and the rear wall panel 101 (not shown), in such a position as to align with the lip portion 43 which extends around the periphery of the front and rear opening-defining portions of frame unit 1. Seal 97 bears against the lip portion 43 of flange trough 85 to tightly seal the front door and rear wall panel to enclosure frame 1.

Figure 7:
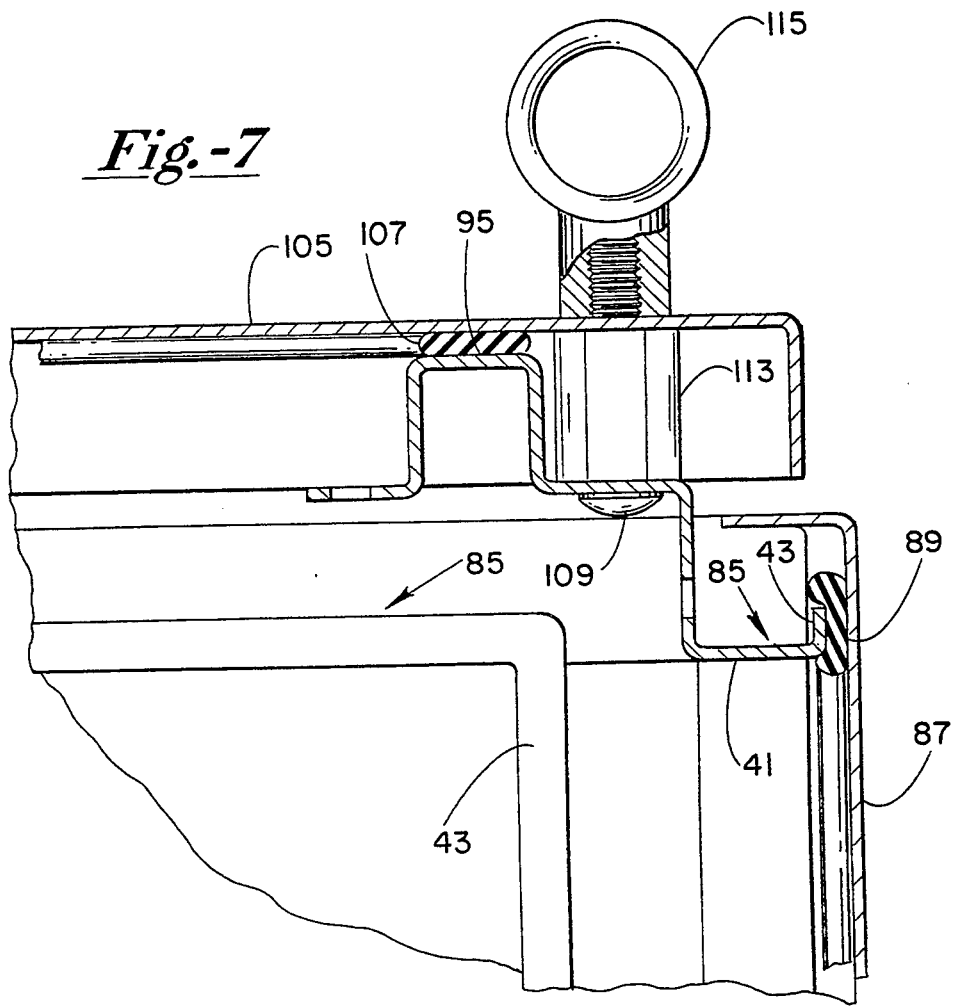
FIG. 7 is a fragmentary vertical sectional view taken through one of the upper cross frame sections of an assembled enclosure similar to that shown in exploded perspective in FIG. 5, showing the integral flange trough formed by the assembled lattice-work of frame sections which comprise our multifaceted modular enclosure frame.
Figure 8:
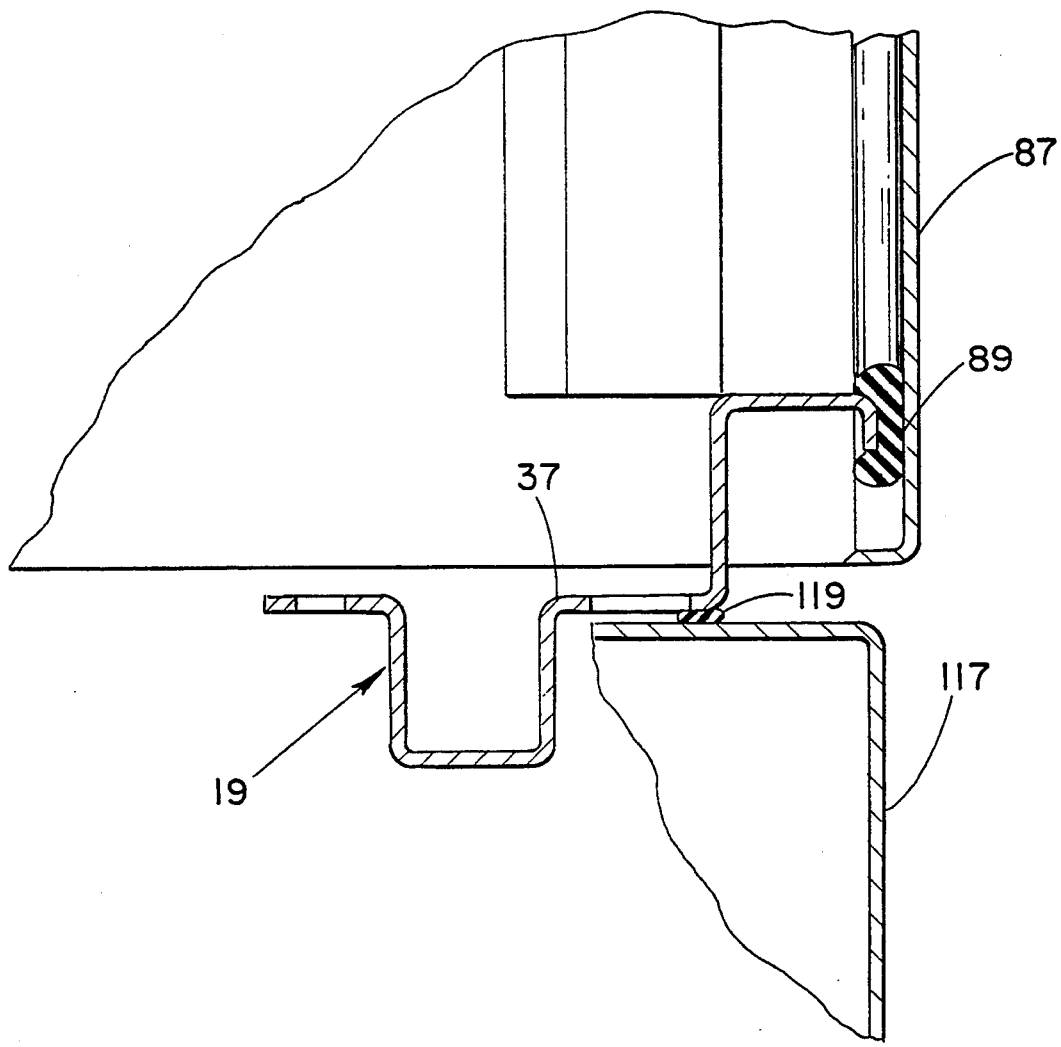
FIG. 8 is a fragmentary vertical sectional view taken through one of the lower base frame sections of an assembled enclosure similar to that shown in exploded perspective in FIG. 5, showing the manner in which the side wall panels and lower base stand seal to our modular enclosure frame.

Similarly, as shown in FIGS. 6–8, each side wall panel 87 carries a peripheral gasket 89 which seals against modular frame unit 1. At the top peripheral portion of side wall panels 87, gasket 89 bears against lip portion 43 of the outwardly extending flange 41 of upper cross frame sections 11 and 15. At the lower peripheral portion of side wall panels 87, gasket 89 seals against the lip portion 43 of the outwardly extending flange 41 of lower cross frame sections 19 and 23. Each vertical peripheral edge of side wall panels 87 are sealed, via gasket 89, against the exter-ior surface 95 of channel member 27, which is formed in each of the upstanding frame sections 3, 5, 7 and 9.

As best seen in FIG. 7, the top cover 105 also carries a continuous peripheral seal 107 which aligns with the exterior surface 95 of all upper cross frame sections 11, 13, 15 and 17. Top cover 105 is secured in sealed relation to frame unit 1 via bolts 109 which extend through openings 111 (shown in FIG. 1), through spacer 113, and into the threaded bore of lift eye 115.

As best seen in FIG. 8, each of the lower cross frame sections 19, 21, 23 and 25, rest upon and seal against a lower base stand 117, via seal 119, which extends around the periphery of stand 117 so as to seal against arm 37 of corner flange 35 of each lower cross frame section. As is evident from the above, each enclosure wall panel is connected to the modular enclosure frame 1 in tightly sealed relation thereagainst, thereby preventing any leakage of moisture into the interior thereof.

Figure 9:
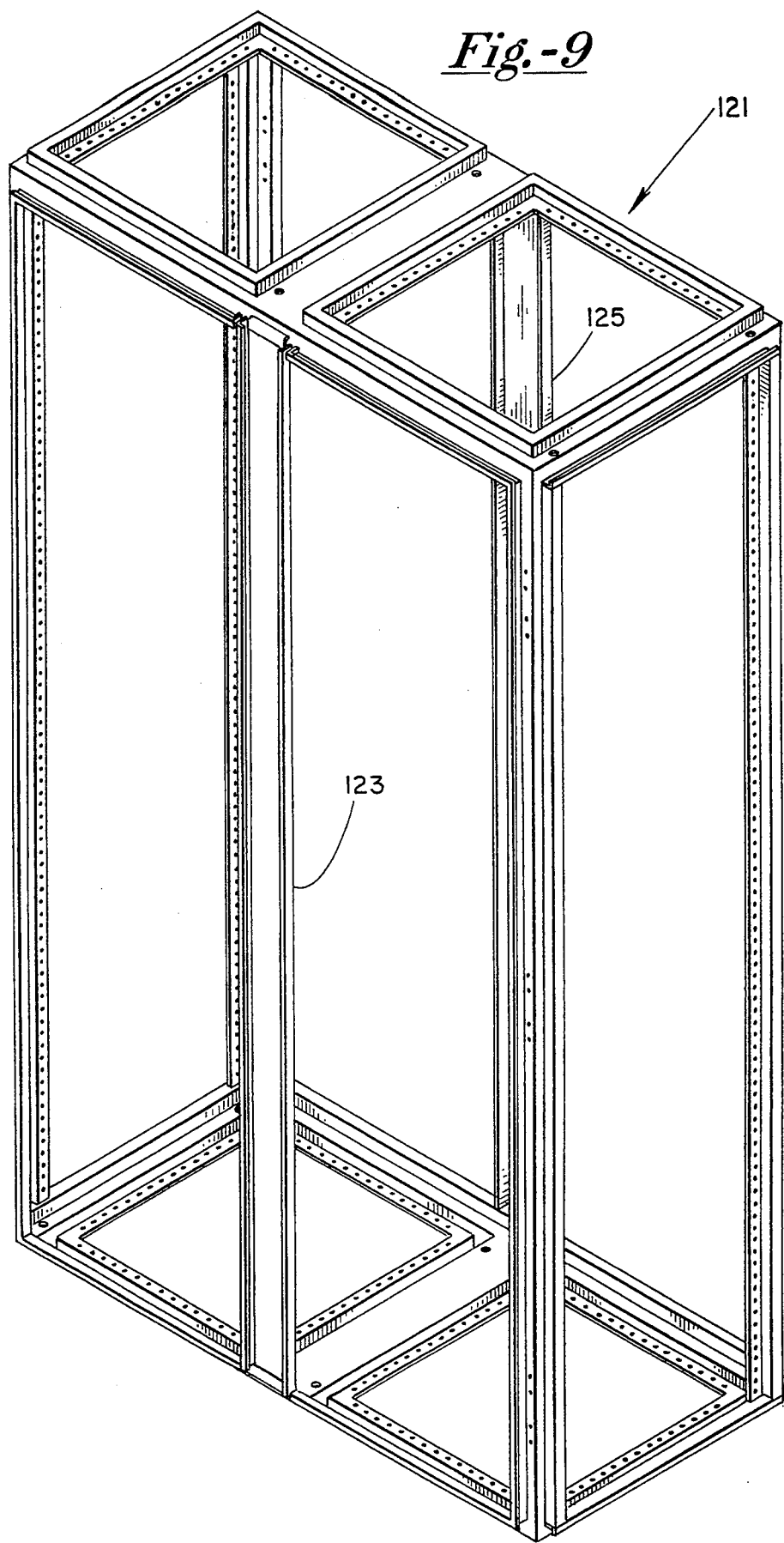
FIG. 9 is a perspective view of a modular double door enclosure frame which is constructed of a plurality of multifaceted frame sections identical to that shown in FIG. 2A.

Shown in FIG. 9 is an alternative double door enclosure frame 121 which is similar in construction to the single door enclosure frame 1, with the exception that the double door enclosure frame 121 includes a front and rear centerpost 123 and 125, respectively. With the exception of centerposts 123 and 125, each frame section has the identical cross-sectional configuration, as shown in FIG. 2. As such, each of the advantages and functions provided by the single door enclosure frame 1 are similarly provided through the construction and use of double door enclosure frame 121.

As is readily apparent from FIG. 9, each side of the double door enclosure is capable of receiving a sub-panel mounting board 49 therewithin, in the same manner as described with respect to the single door enclosure frame 1. As each of the frame sections of the double door enclosure frame 121 are identically constructed as those of the single door enclosure frame 1, each frame section also includes an external corner flange 35 upon which external mounting blocks 73 may be secured, and an external flange trough 85, as previously described. The wall panels for the double door enclosure also seal thereto in the same manner as the wall panels of the single door enclosure frame 1, and flange 45 of each frame section provides a modular array of mounting holes for mounting of interior racks and other accessories.

Our new open-design seven-fold multifaceted enclosure frame provides many benefits over conventional enclosures, and provides a number of user friendly options which facilitate ease in accessibility and restructuring thereof. The open design of each frame section enables ease in maintenance as well as the capability of using conventional hardware therewith. The integral sub-panel guide system of the enclosure frame eliminates the need for manufacturing and installing a separate guide system, which is necessary in order to properly position and install such mounting boards. When assembled, each vertical frame section provides a corner flange upon which a plurality of external mounting blocks may be secured to facilitate external connection of all wall panels thereto.

In addition, a flange trough is defined by the mating frame sections which prevents water and other liquids from pooling against the gaskets of the enclosure and deteriorating the same. All of the above benefits constitute a marked improvement over conventional enclosures, and has been provided through the use of a single cross-sectional design for all sections of the frame, which substantially reduces the cost of manufacturing and assembling the same.

It will, of course, be understood that various changes may be made in the form, details, arrangement and proportions of the parts without departing from the scope of the invention which comprises the matter shown and described herein and set forth in the appended claims.

We claim:

1. A modular enclosure frame for an enclosure assembly which is designed to receive and support sub-panel mounting boards therein and which is enclosed via wall panels mounted to the frame, said frame comprising:

(a) a latticework of upper, lower, and side frame sections being interconnected to form a modular enclosure frame having outer and interior confines, said lower frame sections defining a generally rectangular base frame having adjacent interior corners for such an enclosure assembly; and (b) said rectangular base frame including an elongated inherent interior sub-panel guide means integrally formed therewith for properly guiding and positioning such sub-panel mounting boards within such an enclosure assembly, said sub-panel guide means having a planar glide surface extending unobstructedly the entire length between and into said adjacent interior corners.

2. The structure defined in claim 1, wherein at least said lower frame sections include an integrally formed sub-panel guide channel which is interiorly disposed relative to said outer confines defined by said frame sections, said sub-panel guide means comprising said sub-panel guide channel.

3. The structure defined in claim 1, wherein at least two of said lower frame sections are disposed opposite of and extend parallel to each other in spaced relation, said opposite parallel lower frame sections each defining integrally therewith an elongated channel member, each said channel member being constructed and arranged to receive therein in guiding relation a channel follower which depends from such a sub-panel mounting board that is positioned within such an enclosure assembly.

4. The structure defined in claim 1, wherein each of said frame sections include an generally L-shaped flange integrally formed therewith which, when assembled with said other frame sections, defines an exterior flange trough for channeling fluids which may come in contact with the enclosure around the peripheral portions thereof.

5. The structure defined in claim 1, wherein each of said frame sections includes a generally U-shaped channel element integrally formed therewith, said guide means being defined at least in part by said generally U-shaped channel element of at least some of said frame sections, said channel element having a pair of legs interconnected at one end by a web portion, said web portion having an interiorly disposed surface and an exteriorly disposed surface relative to said outer confines defined by said latticework of assembled frame sections, said exteriorly disposed surface of said web portion of at least some of said frame sections comprising means for sealing such various wall panels of such an enclosure assembly against said latticework of assembled frame sections.

6. The structure defined in claim 1, wherein each of said frame sections is an open design, comprising a channel member having a pair of legs which are interconnected at one end by a web portion; a generally L-shaped exterior corner flange having first and second arms and being cantilevered by said first arm from one of said legs of said channel member, said first arm extending normal thereto and outwardly therefrom away from said channel member, and a second generally L-shaped flange cantilevered from said second arm of said corner flange and extending outwardly therefrom in a direction away from said channel member.

7. The structure defined in claim 6, wherein said second generally L-shaped flange and said second arm of said corner flange of at least some of said frame sections define an exterior flange trough when said frame sections are assembled to form the modular frame, said flange trough being formed integrally with said frame sections and being constructed and arranged to channel fluids which may come in contact with such an enclosure assembly around the peripheral portion thereof.

8. The structure defined in claim 6, wherein said lower frame sections are disposed such that said channel member of each of said lower frame sections opens upwardly, and said generally L-shaped exterior corner flange and said second generally L-shaped flange of each of said lower frame sections graduate generally upwardly and outwardly therefrom toward said outer confines defined by said frame sections when assembled to form the modular frame.

9. The structure defined in claim 6, wherein said leg of said channel member of each said frame section which is disposed most interiorly relative to said outer confines defined by said frame sections when assembled includes a rim which protrudes normally therefrom toward the interior of such an enclosure assembly, said rim having a plurality of spaced mounting holes therein.

10. The structure defined in claim 6, wherein said exterior corner flange includes means for mounting a plurality of exterior wall panel mounting blocks thereto.

11. The structure defined in claim 1, wherein at least some of said frame sections include an exterior corner flange which is constructed and arranged to carry a plurality of external wall panel mounting blocks.

12. A modular enclosure frame for an enclosure assembly which is designed to receive sub-panel mounting boards therein and which is enclosed via wall panels mounted to the frame, said frame comprising:

(a) a latticework of upper, lower, and side frame sections being interconnected to form a modular enclosure frame having outer and interior confines, said lower frame sections defining a base frame for such an enclosure assembly;

(b) said base frame including an inherent interior sub-panel guide means integrally formed therewith for properly guiding and positioning such sub-panel mounting boards within such an enclosure assembly; and (c) at least some of said frame sections include a generally L-shaped flange integrally formed therewith which, when assembled with said other frame sections, defines an exterior flange trough for channeling fluids which may come in contact therewith.

* * * * *